United States Patent
Yamazaki

(10) Patent No.: US 7,351,615 B2
(45) Date of Patent: Apr. 1, 2008

(54) METHOD OF FABRICATING A MIS TRANSISTOR

(75) Inventor: Shunpei Yamazaki, Setegaya-ku (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/406,319

(22) Filed: Apr. 4, 2003

(65) Prior Publication Data

US 2003/0207511 A1  Nov. 6, 2003

Related U.S. Application Data

(60) Division of application No. 08/665,840, filed on Jun. 17, 1996, now Pat. No. 6,544,825, which is a continuation of application No. 08/171,402, filed on Dec. 22, 1993, now abandoned.

(30) Foreign Application Priority Data

Dec. 26, 1992 (JP) .................................. 4-359156
Dec. 26, 1992 (JP) .................................. 4-359157
Dec. 26, 1992 (JP) .................................. 4-359158

(51) Int. Cl.
*H01L 21/00* (2006.01)
(52) U.S. Cl. ............... 438/149; 257/59; 257/E21.372
(58) Field of Classification Search ............... 438/162, 438/164, 166, 149, 308, 487, 488, 492; 257/59, 257/66, 73, E21.372
See application file for complete search history.

(56) References Cited

U.S. PATENT DOCUMENTS 3,848,104 A   11/1974   Locke (Continued)

FOREIGN PATENT DOCUMENTS

| EP | 0 072 216 |     | 4/1989 |
| EP | 0 437 043 | A2  | 7/1991 |
| JP | 55-067132 |     | 5/1980 |
| JP | 56-081973 |     | 7/1981 |

(Continued)

OTHER PUBLICATIONS

Inoue et al., "Low Temperature CMOS Self-Aligned Poly-Si TFTs & . . . New Ion Doping and Mastering Technique," IEDM 91, pp. 555-558, Dec. 8-11, 1991.

(Continued)

*Primary Examiner*—Quoc Hoang
(74) *Attorney, Agent, or Firm*—Eric J. Robinson; Robinson Intellectual Property Law Office, P.C.

(57) ABSTRACT

A method of fabricating MIS transistors starts with formation of gate electrode portions. Then, high-speed ions are irradiated through an insulating film to implant impurity ions into a semiconductor region by a self-aligning process, followed by total removal of the insulating film. The laminate is irradiated with laser light or other similar intense light to activate the doped semiconductor region. Another method of fabricating MIS transistors begins with formation of a gate-insulating film and gate electrode portions. Then, the gate-insulating film is removed, using the gate electrode portions as a mask. The semiconductor surface is exposed, or a thin insulating film is formed on this surface. High-speed ions are irradiated to perform a self-aligning ion implantation process. A further method of fabricating MIS transistors starts with formation of a gate-insulating film and gate electrode portions. Then, the gate-insulating film is etched by a self-aligning process, using the gate electrode portions as a mask, to thin the film. Subsequently, high-speed ions are irradiated to form doped regions in a semiconductor region by a self-aligning process.

30 Claims, 9 Drawing Sheets

U.S. PATENT DOCUMENTS

| | | | |
|---|---|---|---|
| 4,046,618 A | 9/1977 | Chaudhari et al. | |
| 4,059,461 A | 11/1977 | Fan et al. | |
| 4,083,272 A | 4/1978 | Miller | |
| 4,160,263 A | 7/1979 | Christy et al. | |
| 4,234,358 A | 11/1980 | Celler et al. | |
| 4,249,960 A | 2/1981 | Schnable et al. | |
| 4,309,225 A | 1/1982 | Fan et al. | |
| 4,328,553 A | 5/1982 | Fredriksen et al. | |
| 4,341,569 A | 7/1982 | Yaron et al. | |
| 4,370,175 A | 1/1983 | Levatter | |
| 4,377,902 A * | 3/1983 | Shinada et al. | 29/576 B |
| 4,385,937 A | 5/1983 | Ohmura | |
| 4,439,245 A | 3/1984 | Wu | |
| 4,463,028 A | 7/1984 | Laude | |
| 4,468,551 A | 8/1984 | Neiheisel | |
| 4,468,853 A * | 9/1984 | Morita et al. | 438/72 |
| 4,468,855 A | 9/1984 | Sasaki | |
| 4,469,551 A | 9/1984 | Laude | |
| 4,533,831 A | 8/1985 | Itoh et al. | |
| 4,545,823 A | 10/1985 | Drowley | |
| 4,693,758 A * | 9/1987 | Kobayashi et al. | 437/174 |
| 4,727,044 A | 2/1988 | Yamazaki | |
| 4,734,550 A | 3/1988 | Imamura et al. | |
| 4,764,485 A | 8/1988 | Loughran et al. | |
| 4,803,528 A | 2/1989 | Pankove | |
| 4,835,704 A | 5/1989 | Eichelberger et al. | |
| 4,862,227 A | 8/1989 | Tsuge et al. | |
| 4,937,618 A | 6/1990 | Ayata et al. | |
| 4,943,837 A | 7/1990 | Konishi et al. | |
| 4,956,539 A | 9/1990 | Uesugi et al. | |
| 4,970,366 A | 11/1990 | Imatou et al. | |
| 4,976,930 A * | 12/1990 | Kishida et al. | 422/186.3 |
| 5,141,885 A | 8/1992 | Yoshida et al. | |
| 5,145,808 A | 9/1992 | Sameshima et al. | |
| 5,200,630 A * | 4/1993 | Nakamura et al. | 257/570 |
| 5,217,921 A | 6/1993 | Kaido et al. | |
| 5,219,786 A | 6/1993 | Noguchi | |
| 5,221,365 A | 6/1993 | Noguchi et al. | |
| 5,241,211 A | 8/1993 | Tashiro | |
| 5,252,502 A | 10/1993 | Havemann | |
| 5,264,072 A | 11/1993 | Mukai | |
| 5,283,417 A | 2/1994 | Misawa et al. | |
| 5,289,030 A | 2/1994 | Yamazaki et al. | |
| 5,308,998 A | 5/1994 | Yamazaki et al. | |
| 5,313,076 A | 5/1994 | Yamazaki et al. | |
| 5,348,897 A | 9/1994 | Yen | |
| 5,348,903 A | 9/1994 | Pfiester et al. | |
| 5,352,291 A | 10/1994 | Zhang et al. | |
| 5,372,089 A | 12/1994 | Yoshida et al. | |
| 5,372,836 A | 12/1994 | Imahashi et al. | |
| 5,393,957 A | 2/1995 | Misawa et al. | |
| 5,413,958 A | 5/1995 | Imahashi et al. | |
| 5,424,244 A | 6/1995 | Zhang et al. | |
| 5,477,073 A | 12/1995 | Wakai et al. | |
| 5,533,040 A | 7/1996 | Zhang | |
| 5,545,571 A | 8/1996 | Yamazaki et al. | |
| 5,561,081 A | 10/1996 | Takenouchi et al. | |
| 5,578,520 A | 11/1996 | Zhang et al. | |
| 5,612,251 A | 3/1997 | Lee | |
| 5,622,814 A | 4/1997 | Miyata et al. | |
| 5,643,801 A | 7/1997 | Ishihara et al. | |
| 5,648,277 A | 7/1997 | Zhang et al. | |
| 5,696,003 A | 12/1997 | Makita et al. | |
| 5,712,191 A | 1/1998 | Nakajima et al. | |
| 5,756,364 A | 5/1998 | Tanaka et al. | |
| 5,891,764 A | 4/1999 | Ishihara et al. | |
| 5,962,897 A | 10/1999 | Takemura et al. | |
| 5,977,559 A | 11/1999 | Zhang et al. | |
| 6,031,290 A | 2/2000 | Miyazaki et al. | |
| 6,087,277 A | 7/2000 | Shih et al. | |
| 6,235,563 B1 * | 5/2001 | Oka et al. | 438/166 |
| 6,410,374 B1 | 6/2002 | Yamazaki | |
| 6,544,825 B1 | 4/2003 | Yamazaki | |
| 6,709,905 B2 * | 3/2004 | Kusumoto et al. | 438/161 |
| 2003/0207511 A1 | 11/2003 | Yamazaki | |

FOREIGN PATENT DOCUMENTS

| | | |
|---|---|---|
| JP | 57-058363 | 4/1982 |
| JP | 57-094482 | 6/1982 |
| JP | 57-104218 | 6/1982 |
| JP | 57-193291 | 11/1982 |
| JP | 58-023479 | 2/1983 |
| JP | 58-071663 | 4/1983 |
| JP | 58-092213 | 6/1983 |
| JP | 58-164134 | 9/1983 |
| JP | 60-202931 | 10/1985 |
| JP | 61-048979 | 3/1986 |
| JP | 61-014581 | 7/1986 |
| JP | 61-145819 | 7/1986 |
| JP | 63-080987 | 4/1988 |
| JP | 63-194326 | 8/1988 |
| JP | 63-314862 | 12/1988 |
| JP | 64-053462 | 3/1989 |
| JP | 01-212431 | 8/1989 |
| JP | 02-228043 | 9/1990 |
| JP | 02-277244 | 11/1990 |
| JP | 02-283016 | 11/1990 |
| JP | 03-020046 | 1/1991 |
| JP | 03-034434 | 2/1991 |
| JP | 03-062971 | 3/1991 |
| JP | 03-159119 | 7/1991 |
| JP | 03-281073 | 12/1991 |
| JP | 04-039967 | 2/1992 |
| JP | 04-206836 | 7/1992 |
| JP | 04-299534 | 10/1992 |
| JP | 04-340725 | 11/1992 |
| JP | 04-360580 | 12/1992 |
| JP | 06-204250 | 7/1994 |
| JP | 2585158 | 11/1996 |
| JP | 3031398 | 4/2000 |

OTHER PUBLICATIONS

J.M. Poate (ed.), "Laser Annealing of Semiconductors," Epitaxy by Pulsed Annealing of Io-Implanted Silicon, Foti et al., (1982) Academic Press, pp. 203-245.

Young et al., "Effect of Pulse Duration on the Annealing of Ion Implanted Silicon With a XeCL Excimer Laser and Solar Cells," in Laser-Solid Interactions and Transient Thermal Processing of Materials, 1983, pp. 401-406.

Biegelsen et al. "Laser-Induced Crystallization of Silicon on Bulk Amorphous Substrates: An Overview" in Laser-Solid Interactions and Transient Thermal Processing of Materials, 1983, pp. 537-548.

Koriyama et al., High-Mobility Poly-Si TFT by a New Excimer Laser Annealing Method for Large Area Electronics, pp. 563-566 (IEEE), 1991.

S. Wolf, "Silicon Processing for the VLSI Era," vol. 2, pp. 66-67, 1990.

Devor et al., "Nd:YAG Quantum Efficiency and Related Radiative Propertieis," pp. 1863-1873, (IEEE), 1984.

Daisuke Makino, *Application of Polyimide Resin to Semiconductor Devices in Japan*, IEEE Electrical Insulation Magazine, Mar./Apr. 1988, vol. 4, No. 2, pp. 15-23.

Biegelsen et al., *Laser-Induced Crystallization of Silicon on Bulk Amorphous Substrates: An Overview*, Laser-Solid Interactions and Transient Thermal Processing of Materials, 1983, vol. 13, pp. 537-548.

Kuriyama et al., *High Mobility Poly-Si TFT by a New Excimer Laser Annealing Method for Large Area Electronics*, pp. 563-566 (IEEE), 1991.

Devor et al., *Nd: YAG Quantum Efficiency and Related Radiative Properties*, pp. 1863-1873 (IEEE), 1984, vol. 25, No.8.

* cited by examiner

METHOD OF FABRICATING A MIS TRANSISTOR

FIELD OF THE INVENTION

The present invention relates to a method of fabricating MIS transistors and, more particularly, to a method of fabricating MIS transistors having improved crystallinity by illuminating a high-speed ions to implant impurities into a semiconductor region and then improving the crystallinity by laser annealing, lamp annealing, or illumination of other equivalent intense light.

BACKGROUND OF THE INVENTION

A structure comprising a semiconductor layer (S) on which a thin insulating film (I) and metal control electrodes (M) are formed is known as a MIS structure. A transistor having such a structure to control the electrical current flowing through the semiconductor layer is referred to as a MIS transistor. Where the insulating film is made of silicon oxide, the transistor is called a MOS transistor.

In the past, the activation step (for removing crystal defects produced on impurity implantation) conducted after the implantation of impurities into such MIS transistors has been carried out by thermal annealing. For this step, a high temperature as high as more than 1000° C. is needed. In recent years, there is a demand for lower-temperature processes. Accordingly, alternatives to such high-temperature thermal annealing have been discussed. One promising method is to illuminate laser light or other intense light, for effecting activation. Depending on the used light source, this method is called laser annealing or lamp annealing.

A conventional method of fabricating MIS transistors, using laser annealing, is now described by referring to FIGS. 4(A)-4(E). An insulating film 402 is deposited as a base layer on a substrate 401. Then, a substantially intrinsic crystalline semiconductor film is deposited. This is photolithographically patterned into island-shaped semiconductor regions 403. Thereafter, an insulating film 404 acting as a gate-insulating film is deposited. Subsequently, gate electrodes 405 are deposited (FIG. 4(A)).

If necessary, the gate electrodes are anodized to form an anodic oxide 406 on the top and side surfaces of the gate electrodes and conductive interconnects. This method for forming such an anodic oxide and its merits are described in detail in Japanese Patent application Ser. Nos. 30220/1992, 34194/1992, 38637/1992, etc. Of course, this anodization step may be omitted if not necessary (FIG. 4(B)).

Then, an impurity is implanted by ion implantation or ion (plasma) doping. In particular, the substrate is placed in a fast stream of ions. Using the gate electrode portions, i.e., the gate electrodes and the surrounding anodic oxide, as a mask, an impurity is implanted into the island-shaped semiconductor regions 403 by a self-aligning process. In this way, doped regions 407 which will act as source and drain are formed (FIG. 4(C)).

Thereafter, intense light such as laser light is illuminated to recover the crystallinity which was deteriorated by the previous impurity implantation step (FIG. 4(D)).

An interlayer insulator 408 is then deposited, and contact holes are formed in it. Source and drain electrodes 409 are formed, thus completing MIS transistors (FIG. 4(E)).

In the method described above, when impurities are implanted, a large amount of impurities is introduced also into the gate-insulating film 404. These impurities themselves act as cores absorbing the laser light. In addition, defects produced by the impurity implantation absorb the laser light strongly. Especially, UV light is absorbed much, and light strong enough to activate the doped semiconductor regions 407 does not reach these regions. Usually, the insulating film is made of silicon oxide. The laser light is emitted from an excimer laser which has an excellent mass-producibility. If the silicon oxide is pure, it is sufficiently transparent to UV light emitted from an excimer laser. However, if impurities such as phosphorus and boron are present, the transparency deteriorates greatly. Hence, the activation is not sufficiently done.

If the doped regions are not sufficiently activated in this way, their resistivities are increased. It substantially follows that a resistor is inserted in series between source and drain. That is, the apparent mobility of the transistor drops. Also, the rising characteristics, or steepness, obtained when the transistor is turned on deteriorate.

SUMMARY OF THE INVENTION

In view of the foregoing problems, the present invention has been made. It is an object of the present invention to provide a method of efficiently carrying out an activation step using laser illumination.

If the thickness of the gate-insulating film described above is increased, then the breakdown voltage of the transistor is improved. However, this also requires that the accelerating voltage for the impurity ions be increased and that the implantation time be increased. Especially, where shallow doped regions are formed, a quite highly monochromatic ion beam is needed. In consequence, the dosage per unit time deteriorates severely.

On the other hand, where the gate-insulating film is removed and the semiconductor surface is exposed to efficiently conduct the implantation step, the surface is roughened when laser light or other intense radiation is illuminated and the doped regions are activated. As a result, the contact holes are deteriorated to an intolerable level.

It is another object of the invention to provide a method of efficiently carrying out an implantation step and a laser activation step.

In one embodiment of the present invention, an insulating film is formed as a gate-insulating film. Impurity ions are implanted into a semiconductor region through all or parts of the insulating film by irradiation of high-speed ions. Then, the insulating film is removed excluding the portions located under the gate electrode portions, thus exposing the semiconductor region. Laser light or other equivalent intense light is illuminated to perform an anneal. The above-described absorption of light by the insulating film does not take place. Activation can be done quite efficiently.

In another embodiment of the invention, a first insulating film is formed as a gate-insulating film. Using the gate electrode portions as a mask, the first insulating film is removed by a self-aligning process to expose the semiconductor surface. Then, impurity ions are implanted into the exposed semiconductor layer by irradiation of high-speed ions. Thereafter, a second insulating film of an appropriate thickness is formed on the exposed semiconductor layer. Thereafter, the semiconductor layer is irradiated with laser light or equivalent intense light through the second insulating film to perform an anneal. In this method, the above-described deterioration in the implantation efficiency is prevented. Rather, an ion implantation step and a subsequent activation step can be accomplished quite efficiently.

In a further embodiment of the invention, a first insulating film is formed as a gate-insulating film. Using the gate electrode portions as a mask, the first insulating film is removed by a self-aligning process to expose the semiconductor layer surface. Then, a second insulating film of an appropriate thickness is formed on the semiconductor layer. Impurity ions are implanted into the semiconductor region through the second insulating film by irradiation of high-speed ions. Thereafter, the semiconductor layer is irradiated with laser light or other equivalent intense light to perform an anneal. In this method, the above-described decrease in the implantation efficiency is prevented. Rather, an ion implantation step and a subsequent activation step can be accomplished quite efficiently.

In a still other embodiment of the invention, an insulating film is formed as a gate-insulating film. Using the gate electrode portions as a mask, the insulating film is etched to reduce its thickness to such an extent that ions of appropriate energy penetrate the film. Impurity ions are implanted into a semiconductor region by irradiation of high-speed ions through the thinned insulating film. Then, the semiconductor layer is irradiated with laser light or other equivalent intense light to perform an anneal. Prior to the laser irradiation, a transparent insulating film may be formed on the semiconductor layer surface. In this method, the above-described decrease in the implantation efficiency is prevented. Rather, an ion implantation step and a subsequent activation step can be accomplished quite efficiently. Other objects and features of the invention will appear in the course of the description thereof, which follows.

DETAILED DESCRIPTION OF THE INVENTION

EXAMPLE 1

Figure 1A:
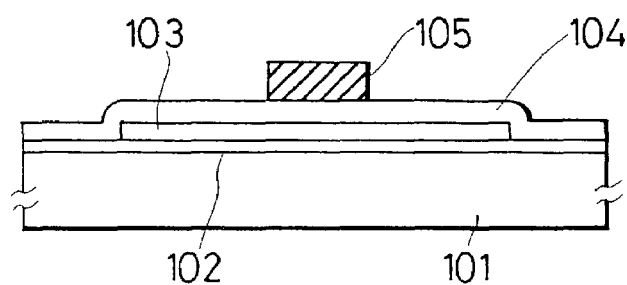
FIGS. 1(A)-1(E) are cross-sectional views of MIS transistors, illustrating steps performed to fabricate the transistors according to the invention.
Figure 1B:
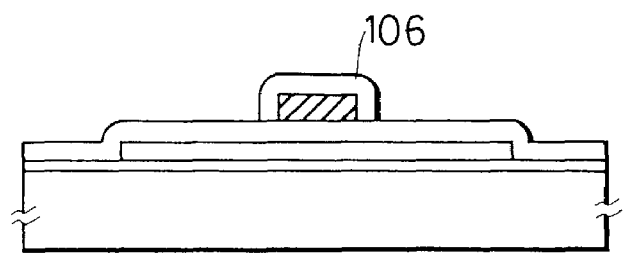
Figure 1C:
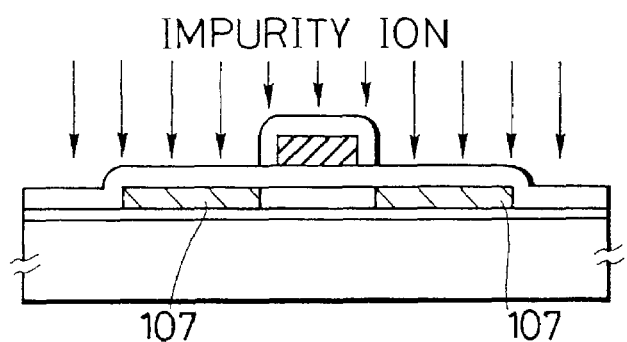
Figure 1D:
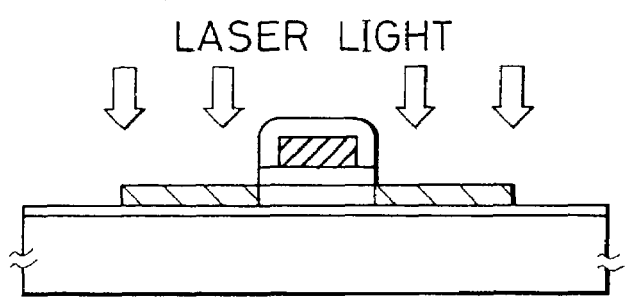
Figure 1E:
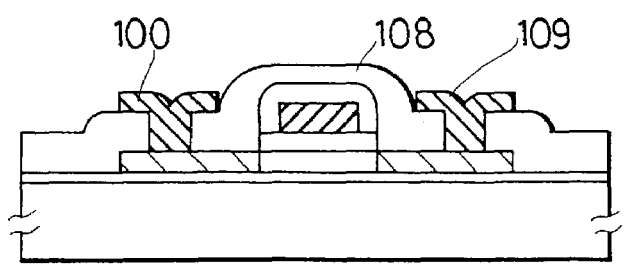
Figure 2A:
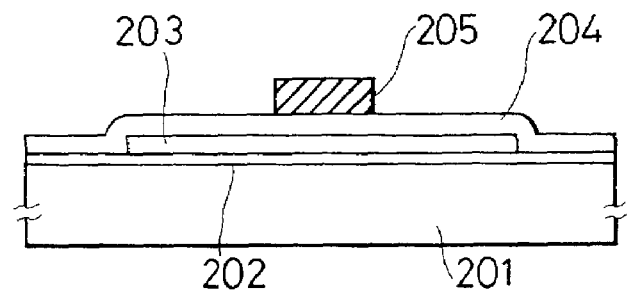
FIGS. 2(A)-2(E) are cross-sectional views of other MIS transistors, illustrating steps performed to fabricate the transistors according to the invention.
Figure 2B:
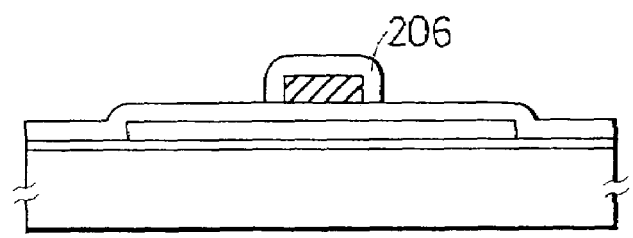
Figure 2C:
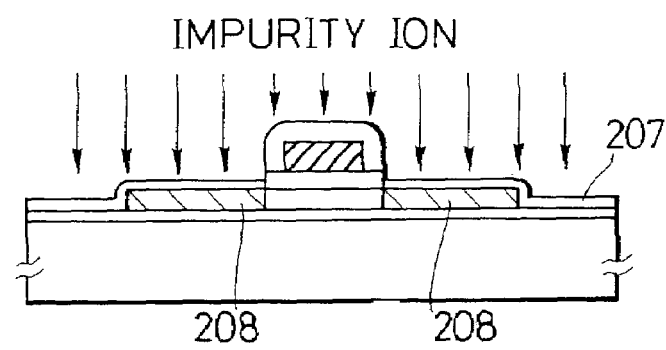
Figure 2D:
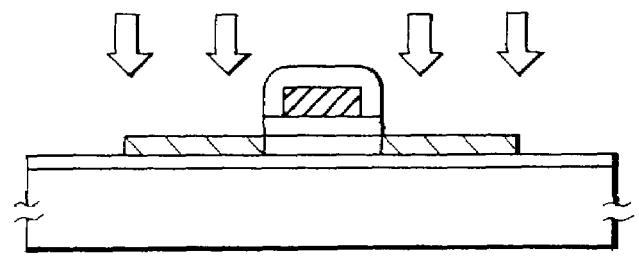
Figure 2E:
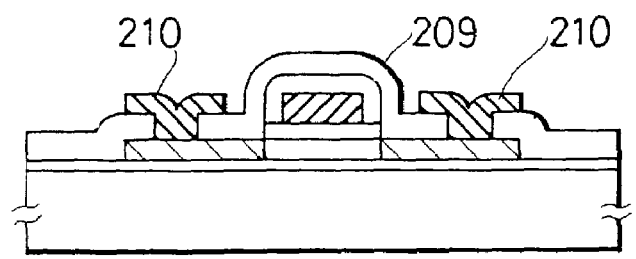
Figure 3A:
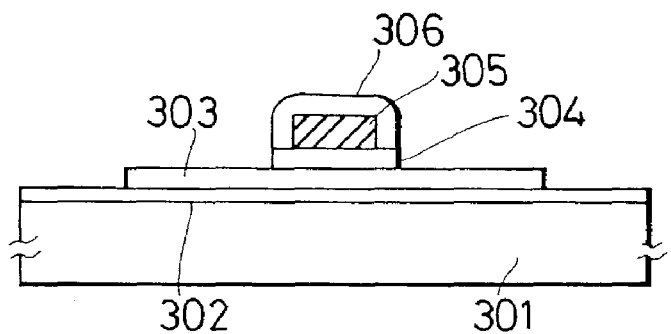
FIGS. 3(A)-3(D) are cross-sectional views of further MIS transistors, illustrating steps performed to fabricate the transistors according to the invention.
Figure 3B:
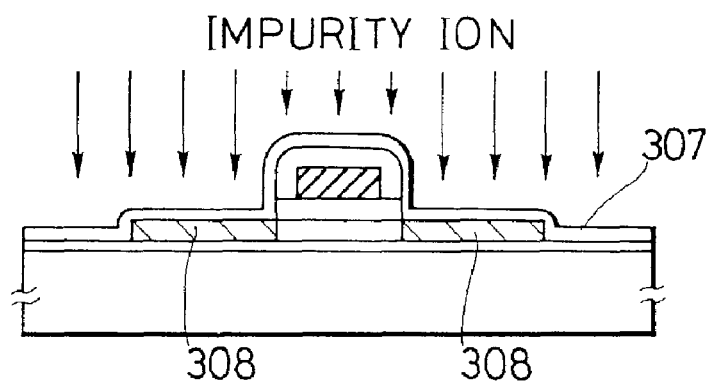
Figure 3C:
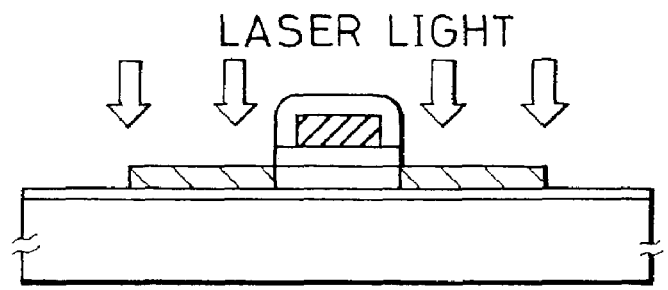
Figure 3D:
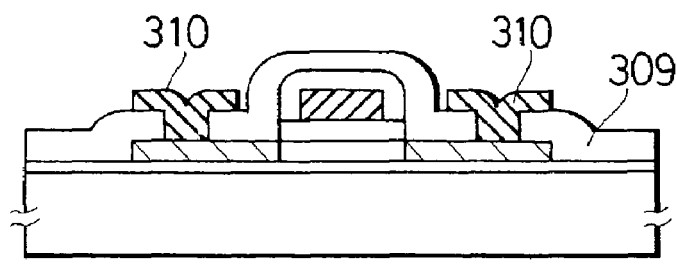
Figure 4A:
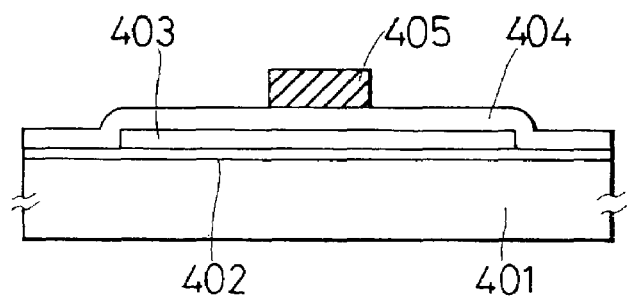
FIGS. 4(A)-4(E) are cross-sectional views of MIS transistors, illustrating steps performed to fabricate the transistors by the prior art method.
Figure 4B:
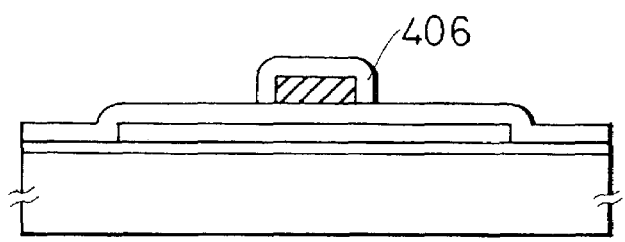
Figure 4C:
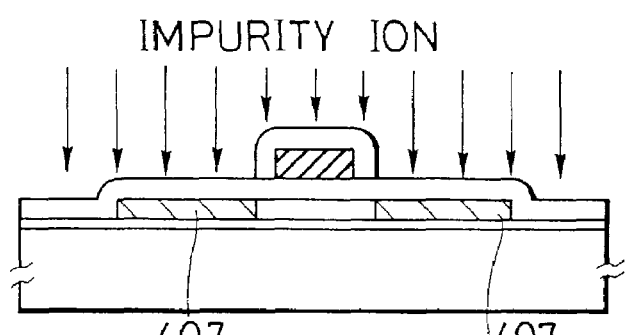
Figure 4D:
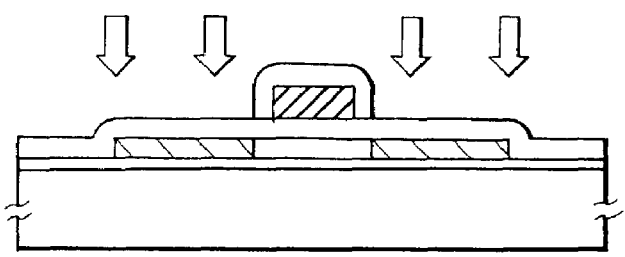
Figure 4E:
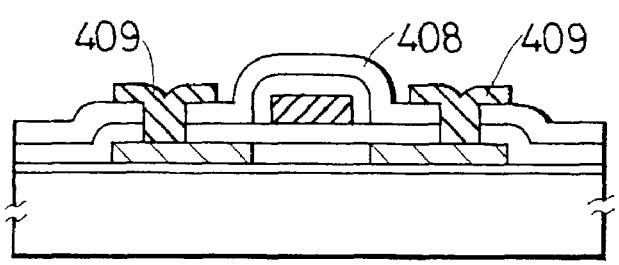
Figure 5A:
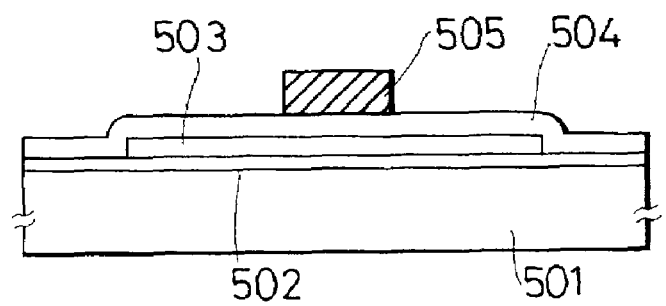
FIGS. 5(A)-5(E) are cross-sectional views of yet other MIS transistors, illustrating steps performed to fabricate the transistors according to the invention.
Figure 5B:
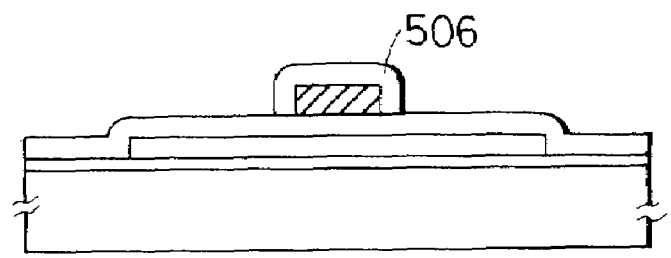
Figure 5C:
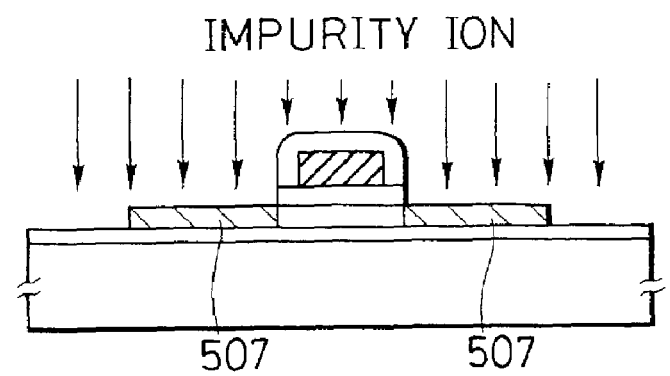
Figure 5D:
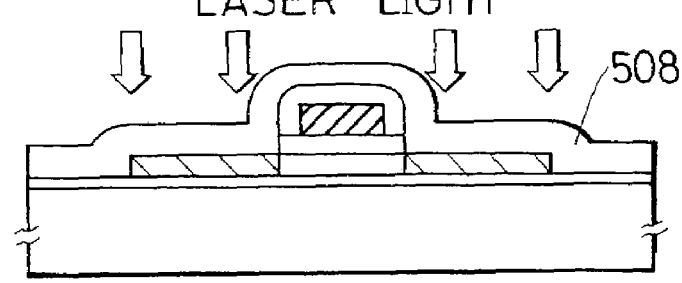
Figure 5E:
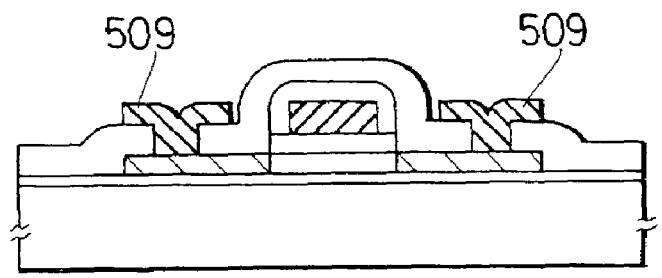
Figure 6A:
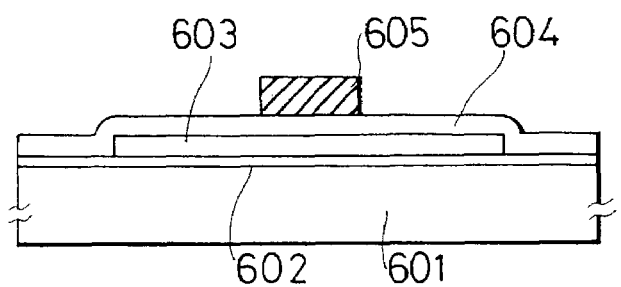
FIGS. 6(A)-6(E) are cross-sectional views of still other MIS transistors, illustrating steps performed to fabricate the transistors according to the invention.
Figure 6B:
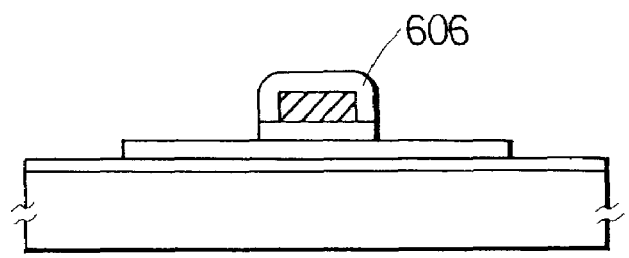
Figure 6C:
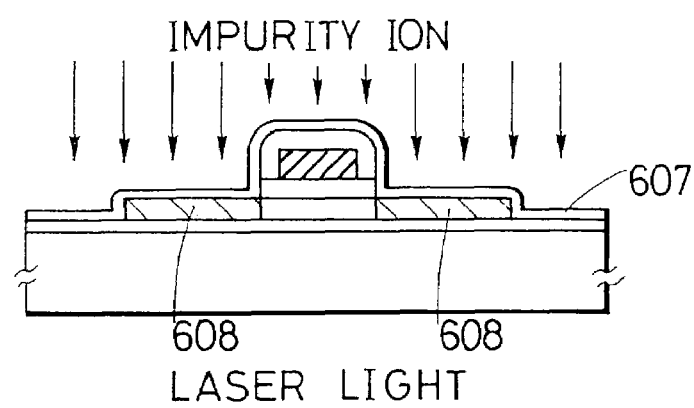
Figure 6D:
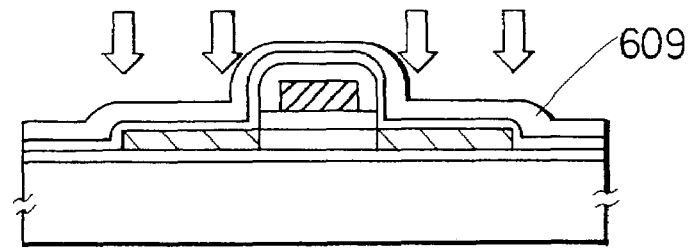
Figure 6E:
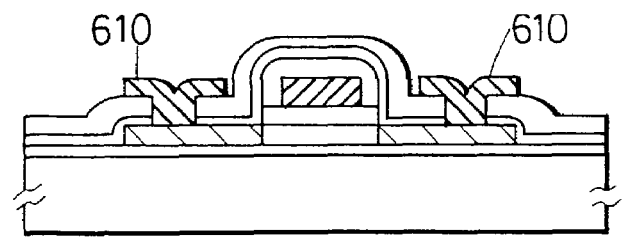

The present example is illustrated in FIGS. 1(A)-1(E). Silicon oxide was deposited as an insulating base film 102 having a thickness of 1000 Å on a non-alkali glass substrate 101 made of Corning 7059 or the like. A substantially intrinsic amorphous silicon film having a thickness of 1500 Å was formed on the insulating film 102. This amorphous film was annealed at 600° C. for 12 hours to crystallize this film. This crystallized film was photolithographically patterned into island-shaped semiconductor regions 103. A silicon oxide film 104 having a thickness of 1200 Å was deposited as a gate-insulating film. Gate electrodes 105 having a thickness of 6000 Å were fabricated from aluminum (FIG. 1(A)).

Then, the gate electrodes were anodized to form an anodic oxide 106 on the top and side surfaces of the gate electrodes and conductive interconnects. The method of fabricating such an anodic oxide and its merits are described in detail in above-cited Japanese Patent application Ser. Nos. 30220/1992, 34194/1992, 38637/1992, etc. Of course, this anodization step may be omitted if not necessary (FIG. 1(B)).

Thereafter, a stream of plasma of phosphorus/hydrogen accelerated at 65-100 keV (e.g., 80 keV) was irradiated to implant phosphorus ions into the island-shaped semiconductor regions 103 by a self-aligning process. Thus, doped regions 107 which would become source and drain were formed (FIG. 1(C)).

Using the anodic oxide as a mask, the gate-insulating film 104 was etched, thus exposing the surfaces of the doped semiconductor regions 107. Laser light (having a wavelength of 248 nm) emitted from a KrF excimer laser was illuminated to recover the crystallinity of the semiconductor regions 107 which was deteriorated by the previous impurity implantation step. At this time, the energy density was 150 to 300 mJ/cm$^2$, e.g., 200 mJ/cm$^2$ (FIG. 1(D)).

Subsequently, an interlayer insulator 108 was deposited, and contact holes were formed in it. Source and drain electrodes 109 were formed. In this way, N-channel transistors were completed (FIG. 1(E)).

P-channel transistors can be similarly built. If well-known CMOS fabrication techniques are used, N- and P-channel transistors can be both formed on the same substrate. The typical mobility of N-channel MOS transistors fabricated in the present example was 120 cm$^2$/V·s. The typical mobility of P-channel MOS transistors fabricated in the present example was 80 cm$^2$/V·s. With respect to CMOS shift registers consisting of 5 stages and comprising N- and P-channel transistors formed on the same substrate, synchronization of 15 MHz was confirmed at a drain voltage of 20 V.

EXAMPLE 2

The present example is illustrated in FIGS. 2(A)-2(E). Silicon oxide was deposited as an insulating base film 202 having a thickness of 1000 Å on a sheet of non-alkali glass 201. A substantially intrinsic amorphous silicon semiconductor film having a thickness of 500 Å was formed on the insulating film 202. The amorphous semiconductor film was illuminated with KrF laser light to crystallize the film. Preferably, the energy density of the laser light was 250 to 400 mJ/cm$^2$. Where the substrate was maintained at 300-550° C. during the laser irradiation, good characteristics were obtained.

The silicon film crystallized in this way was photolithographically patterned into island-shaped semiconductor regions 203. Silicon oxide was deposited as a gate-insulating film 204 having a thickness of 1200 Å on the island-shaped regions 203. Then, gate electrodes 205 of aluminum having a thickness of 6000 Å were formed (FIG. 2(A)).

Then, the gate electrodes were anodized to deposit an anodic oxide 206 on the top and side surfaces of the gate electrodes and conductive interconnects. Of course, this anodic oxidation step may be omitted if not necessary (FIG. 2(B)).

Thereafter, using the gate electrode portions as a mask, the gate-insulating film 204 was etched to a depth of about 200 to 700 Å by vapor phase etching, thus decreasing the thickness of the gate-insulating film. In this way, a thin insulating film 207 was formed. A stream of phosphorus/hydrogen plasma accelerated at 25 to 70 keV, e.g., 50 keV, was irradiated to implant phosphorus ions into the island-shaped regions 203 by a self-aligning process. As a result, doped regions 208 which would become source and drain were formed (FIG. 2(C)).

Generally, the breakdown voltage of a gate-insulating film can be increased as the thickness is increased. However, if ions are implanted through a thick insulating film, the accelerating energy for the ions is increased. Especially, where these ions contain ions having different masses or different scattering cross sections, unwanted ions may be implanted deep into the substrate. For example, in order to implant monovalent phosphorus ions to a depth of 1500 Å, an energy of 100 keV is necessary. Hydrogen ions accelerated at the same time are implanted to a depth of 5000 Å. That is, there is the possibility that the ions are transmitted through the gate electrodes and reach the gate-insulating film and even the underlying semiconductor region. This problem can be solved by reducing the thickness of the insulating film on the doped regions down to a required value.

After the completion of the ion implantation, the gate-insulating film 204 was etched, using the anodic oxide as a mask. In this way, the surfaces of the doped semiconductor regions 208 were exposed. KrF excimer laser light was illuminated to recover the crystallinity of the semiconductor regions 208 which deteriorated in the previous impurity implantation step (FIG. 2(D)).

Thereafter, an interlayer insulator 209 was deposited, and contact holes were formed in this insulator. Source and drain electrodes 210 were formed. Thus, N-channel transistors were completed (FIG. 2(E)).

EXAMPLE 3

The present example is illustrated in FIGS. 3(A)-3(D). Silicon oxide was deposited as an insulating base film 302 having a thickness of 1000 Å on a sheet of non-alkali glass 301. A substantially intrinsic amorphous silicon semiconductor film having a thickness of 500 Å was formed on the insulating film 302. The amorphous semiconductor film was illuminated with KrF laser light to crystallize the film. Preferably, the energy density of the laser light was 250 to 400 mJ/cm². Where the substrate was maintained at 300-550° C. during the laser irradiation, good characteristics were obtained.

The silicon film crystallized in this way was photolithographically patterned into island-shaped semiconductor regions 303. Silicon oxide was deposited as a gate-insulating film 304 having a thickness of 1200 Å on the island-shaped regions 203. Then, gate electrodes 305 of aluminum having a thickness of 6000 Å were formed.

Then, the gate electrodes were anodized to deposit an anodic oxide 306 on the top and side surfaces of the gate electrodes and conductive interconnects. Using the gate electrode portions as a mask, the whole gate-insulating film 304 was etched by a wet etching process (FIG. 3(A)).

Silicon oxide was deposited as a film 307 having a thickness of 200 to 300 Å. A stream of phosphorus/hydrogen plasma accelerated at 10 to 40 keV, e.g., 20 keV, was irradiated to implant phosphorus ions into the island-shaped, semiconductor regions 303 by a self-aligning process. As a result, doped regions 308 which would become source and drain were formed (FIG. 3(B)).

The present example of method is adapted for the case in which the insulating film on the source and drain is made extremely thin. Specifically, in the method of Example 2, the thickness of the remaining insulating film cannot be accurately controlled where the gate-insulating film is thick. For example, where a silicon oxide film of 1200 Å was thinned to 200 Å by the method of Example 2, variations exceeding 200 Å occurred. In the method where the insulating film was deposited as in the present example, variations were less than 50 Å.

After the completion of the ion implantation, the silicon oxide film 307 was totally etched away, using the anodic oxide as a mask. In this way, the surfaces of the doped semiconductor regions 308 were exposed. KrF excimer laser light was illuminated to recover the crystallinity of the semiconductor regions 308 which deteriorated in the previous impurity implantation step (FIG. 3(C)).

Subsequently, an interlayer insulator 309 was deposited, and contact holes were formed in this insulator. Source and drain electrodes 310 were formed. Thus, N-channel transistors were completed (FIG. 3(D)).

EXAMPLE 4

The present example is illustrated in FIGS. 5(A)-5(E). Silicon oxide was deposited as an insulating base film 502 having a thickness of 1000 Å on a sheet of non-alkali glass 501 made of Corning 7059 or the like. A substantially intrinsic amorphous silicon semiconductor film having a thickness of 1500 Å was formed on the insulating film 502. The amorphous semiconductor film was annealed at 600° C. for 12 hours to crystallize it. This crystallized silicon film was photolithographically patterned into island-shaped semiconductor regions 503. Silicon oxide was deposited as a gate-insulating film 504 having a thickness of 1200 Å on the island-shaped regions 503. Then, gate electrodes 505 of aluminum having a thickness of 6000 Å were formed (FIG. 5(A)).

Then, the gate electrodes were anodized to deposit an anodic oxide 506 on the top and side surfaces of the gate electrodes and conductive interconnects. The method of fabricating such an anodic oxide and its merits are described in detail in the above-cited Japanese Patent application Ser. Nos. 30220/1992, 34194/1992, 38637/1992, etc. Of course, this anodization step may be omitted if not necessary (FIG. 5(B)).

The gate-insulating film was then etched by dry etching. Carbon tetrafluoride was used as an etching gas. At this time, the anodic oxide, or alumina, was not etched. As a result, the gate-insulating film was etched excluding the portions located under the gate electrodes 505 and the anodic oxide 506. A stream of phosphorus/hydrogen plasma accelerated at 5 to 20 keV, e.g., 10 keV, was irradiated to implant phosphorus ions into the island-shaped semiconductor regions 503 by a self-aligning process. As a result, doped regions 507 which would become source and drain were formed (FIG. 5(C)).

Subsequently, silicon oxide was deposited as an interlayer insulator 508 having a thickness of 5000 Å. KrF excimer laser light having a wavelength of 248 nm was illuminated to recover the crystallinity of the semiconductor regions 507 which deteriorated in the previous impurity implantation step. At this time, the energy density was 150 to 300 mJ/cm$^2$, e.g., 200 mJ/cm$^2$ (FIG. 5(D)).

Then, contact holes were formed in the interlayer insulator 508. Source and drain electrodes 509 were formed. Thus, N-channel transistors were completed (FIG. 5(E)).

P-channel transistors can be similarly built. If well-known CMOS fabrication techniques are used, N- and P-channel transistors can be both formed on the same substrate. The typical mobility of N-channel MOS transistors fabricated in the present example was 120 cm$^2$/V·s. The typical mobility of P-channel MOS transistors fabricated in the present example was 80 cm$^2$/V·s. With respect to CMOS shift registers consisting of 5 stages and comprising N- and P-channel transistors formed on the same substrate, synchronization of 15 MHz was confirmed at a drain voltage of 20 V.

EXAMPLE 5

The present example is illustrated in FIGS. 6(A)-6(E). Silicon oxide was deposited as an insulating base film 602 having a thickness of 1000 Å on a sheet of non-alkali glass 601. A substantially intrinsic amorphous silicon semiconductor film having a thickness of 500 Å was formed on the insulating film 602. The amorphous semiconductor film was illuminated with KrF laser light to crystallize the film. Preferably, the energy density of the laser light was 250 to 400 mJ/cm$^2$. Where the substrate was maintained at 300-550° C. during the laser irradiation, good characteristics were obtained.

This crystallized silicon film was photolithographically patterned into island-shaped semiconductor regions 603. Silicon oxide was deposited as a gate-insulating film 604 having a thickness of 1200 Å on the island-shaped regions 603. Then, gate electrodes 605 of aluminum having a thickness of 6000 Å were formed (FIG. 6(A)).

Then, the gate electrodes were anodized to deposit an anodic oxide 606 on the top and side surfaces of the gate electrodes and conductive interconnects. Of course, this anodic oxidation step may be omitted if not necessary. Subsequently, using the gate electrode portions as a mask, the gate-insulating film 604 was etched by vapor phase etching to expose the surfaces of the semiconductor regions 603 (FIG. 6(B)).

As a protective film working in an ion implantation process, silicon oxide or silicon nitride 607 was deposited to a thickness of 500 Å over the whole surface A stream of phosphorus/hydrogen plasma accelerated at 25 to 70 keV, e.g., 50 keV, was irradiated to implant phosphorus ions into the island-shaped regions 603 by a self-aligning process. As a result, doped regions 608 which would become source and drain were formed (FIG. 6(C)).

Subsequently, silicon oxide was deposited as an interlayer insulator 609 having a thickness of 5000 Å. KrF excimer laser light was illuminated to recover the crystallinity of the semiconductor regions 608 which deteriorated in the previous impurity implantation step (FIG. 6(D)).

Then, contact holes were formed in the interlayer insulator 609. Source and drain electrodes 610 were formed. Thus, N-channel transistors were completed (FIG. 6(E)).

EXAMPLE 6

The present example was illustrated in FIGS. 7(A)-7(D). Silicon oxide was deposited as an insulating base film 702 having a thickness of 1000 Å on a sheet of non-alkali glass 701. A substantially intrinsic amorphous silicon semiconductor film having a thickness of 500 Å was formed on the insulating film 702. The amorphous semiconductor film was illuminated with KrF laser light to crystallize the film. This crystallized silicon film was photolithographically patterned into island-shaped semiconductor regions 703. Silicon oxide was deposited as a gate-insulating film 704 having a thickness of 1200 Å on the island-shaped regions 703. Then, gate electrodes 705 of aluminum having a thickness of 6000 Å were formed.

Then, the gate electrodes were anodized to deposit an anodic oxide 706 on the top and side surfaces of the gate electrodes and conductive interconnects. Subsequently, using the gate electrode portions as a mask, the gate-insulating film 704 was totally etched by wet etching (FIG. 7(A)).

Then, silicon oxide was deposited as a new silicon oxide film 707 having a thickness of 200 to 300 Å. A stream of phosphorus/hydrogen plasma accelerated at 10 to 40 keV, e.g., 20 keV, was irradiated to implant phosphorus ions into the island-shaped semiconductor regions 703 by a self-aligning process. As a result, doped regions 708 which would become source and drain were formed (FIG. 7(B)).

Figure 7A:
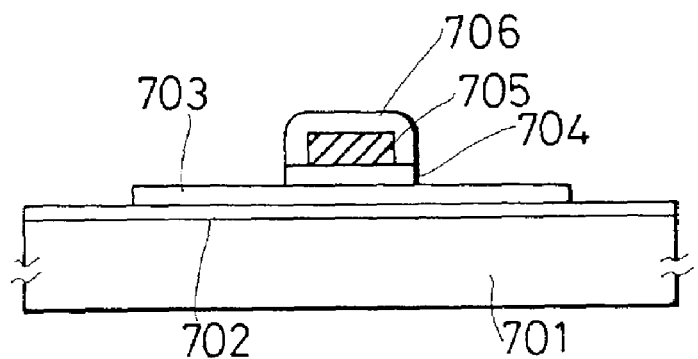
FIGS. 7(A)-7(D) are cross-sectional views of still further MIS transistors, illustrating steps performed to fabricate the transistors according to the invention.
Figure 7B:
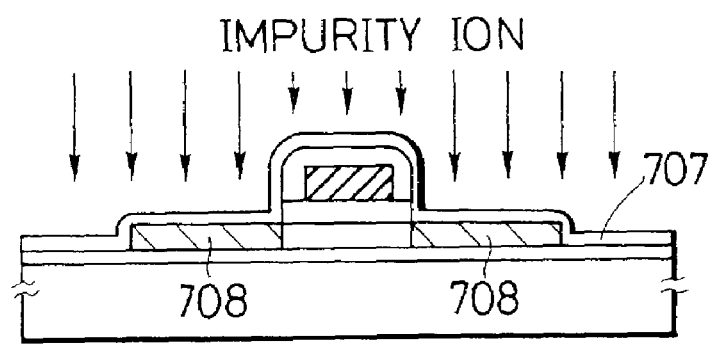
Figure 7C:
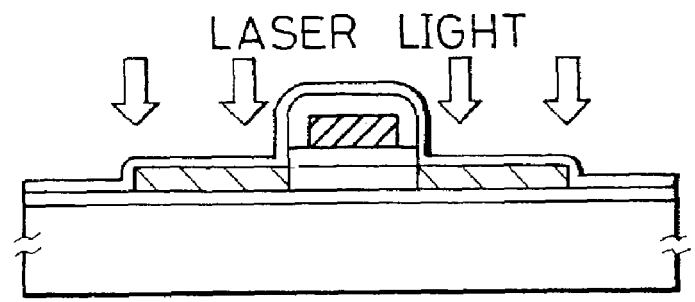
Figure 7D:
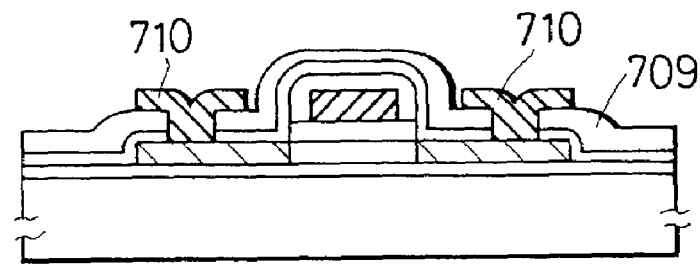
Figure 8A:
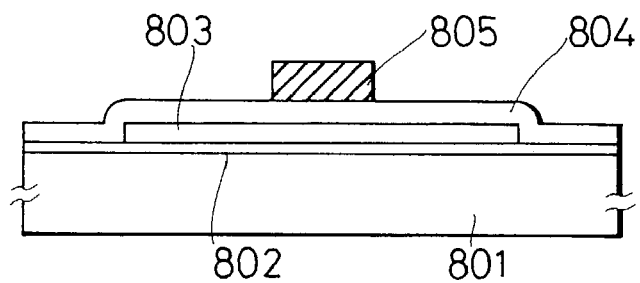
FIGS. 8(A)-8(E) are cross-sectional views of yet other MIS transistors, illustrating steps performed to fabricate the transistors according to the invention.
Figure 8B:
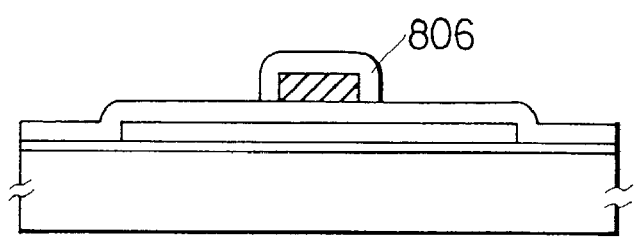
Figure 8C:
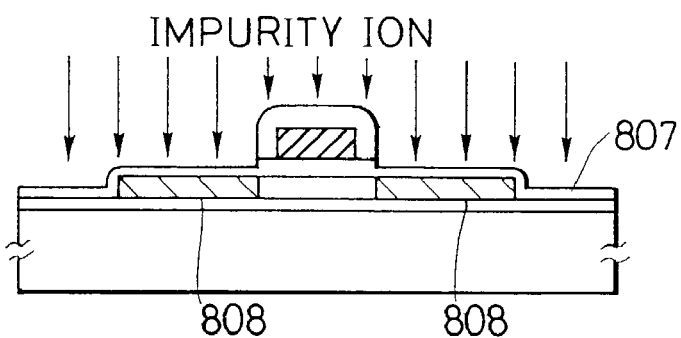
Figure 8D:
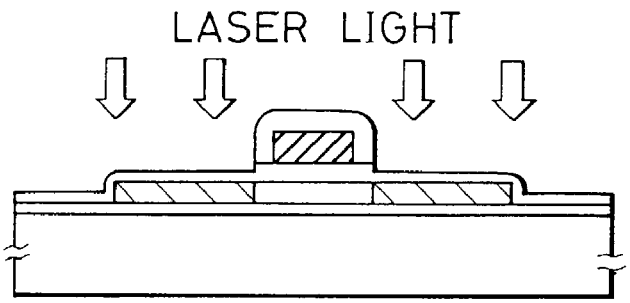
Figure 8E:
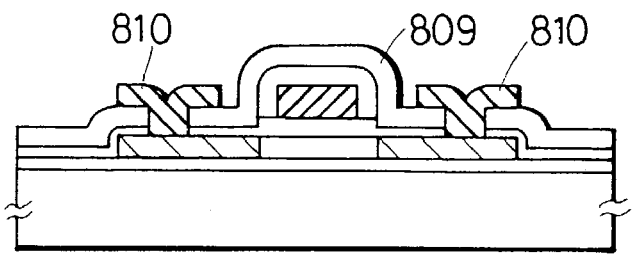
Figure 9A:
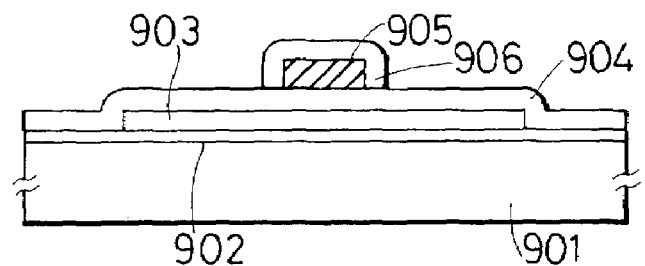
FIGS. 9(A)-9(D) are cross-sectional views of additional MIS transistors, illustrating steps performed to fabricate the transistors according to the invention.
Figure 9B:
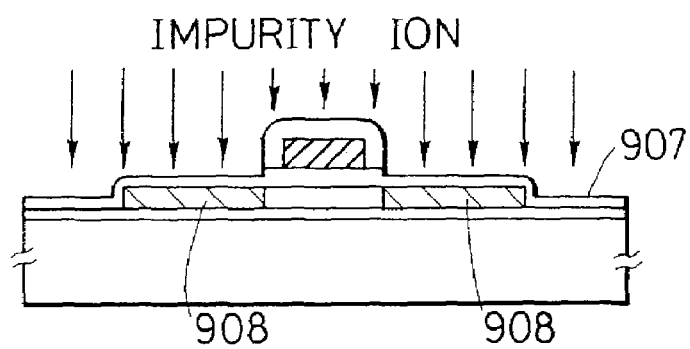
Figure 9C:
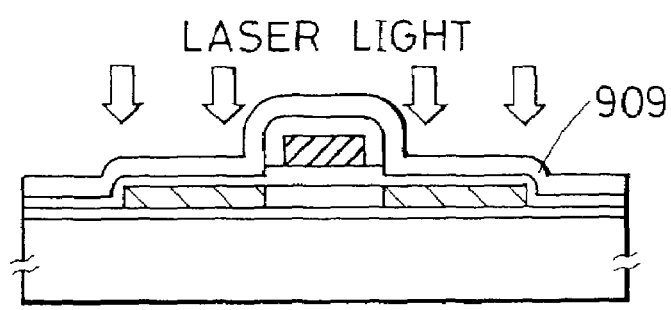
Figure 9D:
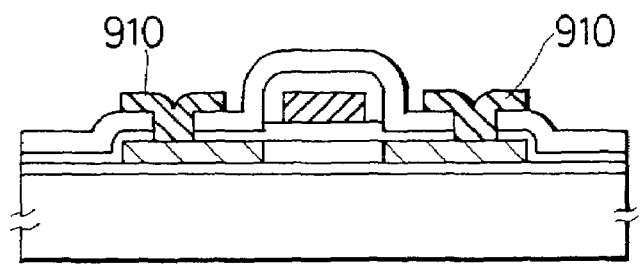

After the completion of the ion implantation step, KrF excimer laser light was illuminated to recover the crystallinity of the semiconductor regions 708 which deteriorated in the previous impurity implantation step (FIG. 7(C)).

Then, an interlayer insulator 709 was deposited, and contact holes were formed in it. Source and drain electrodes 710 were formed. Thus, N-channel transistors were completed (FIG. 7(D)).

EXAMPLE 7

The present example is illustrated in FIGS. 8(A)-8(E). Silicon oxide was deposited as an insulating base film 802 having a thickness of 1000 Å on a substrate of non-alkali glass 801 made of Corning 7059 or the like. A substantially intrinsic amorphous silicon semiconductor film having a thickness of 1500 Å was formed on the insulating film 802. The amorphous semiconductor film was annealed at 600° C. for 12 hours to crystallize it. This crystallized silicon film was photolithographically patterned into island-shaped semiconductor regions 803. Silicon oxide was deposited as a gate-insulating film 804 having a thickness of 1200 Å on the island-shaped regions 803. Then, gate electrodes 805 of aluminum having a thickness of 6000 Å were formed (FIG. 8(A)).

Then, the gate electrodes were anodized to deposit an anodic oxide 806 on the top and side surfaces of the gate electrodes and conductive interconnects. The method of fabricating such an anodic oxide and its merits are described in detail in the above-cited Japanese Patent application Ser. Nos. 30220/1992, 34194/1992, 38637/1992, etc. Of course, this anodization step may be omitted if not necessary (FIG. 8(B)).

The gate-insulating film was then etched by dry etching. Carbon tetrafluoride was used as an etching gas. At this time, the anodic oxide, or alumina, was not etched. As a result, the gate-insulating film was etched excluding the portions located under the gate electrodes 805 and the anodic oxide 806. The etching step was interrupted when the thickness of the gate-insulating film 804 reached 500 Å, and a thin insulating film 807 was formed. A stream of phosphorus/ hydrogen plasma accelerated at 15 to 50 keV, e.g., 30 keV, was irradiated to implant phosphorus ions into the island-shaped semiconductor regions 803 by a self-aligning process. As a result, doped regions 808 which would become source and drain were formed (FIG. 8(C)).

Subsequently, KrF excimer laser light having a wavelength of 248 nm was illuminated to recover the crystallinity of the semiconductor regions 808 which deteriorated in the previous impurity implantation step. At this time, the energy density was 150 to 300 mJ/cm$^2$, e.g., 200 mJ/cm$^2$ (FIG. 8(D)).

Then, an interlayer insulator 809 was deposited and contact holes were formed in the interlayer insulator 809. Source and drain electrodes 810 were formed. Thus, N-channel transistors were completed (FIG. 8(E)).

P-channel transistors can be similarly built. If well-known CMOS fabrication techniques are used, N- and P-channel transistors can be both formed on the same substrate. The typical mobility of N-channel MOS transistors fabricated in the present example was 120 cm$^2$/V·s. The typical mobility of P-channel MOS transistors fabricated in the present example was 80 cm$^2$/V·s. With respect to CMOS shift registers consisting of 5 stages and comprising N- and P-channel transistors formed on the same substrate, synchronization of 15 MHz was confirmed at a drain voltage of 20 V.

EXAMPLE 8

The present example is illustrated in FIGS. 9(A)-9(D). Silicon oxide was deposited as an insulating base film 902 having a thickness of 1000 Å on a substrate of non-alkali glass 901. A substantially intrinsic amorphous silicon semiconductor film having a thickness of 500 Å was formed on the insulating film 902. This amorphous film was crystallized by well-known laser annealing and photolithographically patterned into island-shaped semiconductor regions 903. Silicon oxide was deposited as a gate-insulating film 904 having a thickness of 1200 Å on the island-shaped semiconductor regions 903. Then, gate electrodes 905 of aluminum having a thickness of 6000 Å were formed. Then, the gate electrodes were anodized to deposit an anodic oxide 906 on the top and side surfaces of the gate electrodes and conductive interconnects (FIG. 9(A)).

The gate-insulating film was then etched by dry etching. Carbon tetrafluoride was used as an etching gas. At this time, the anodic oxide, or alumina, was not etched. As a result, the gate-insulating film was etched excluding the portions located under the gate electrodes 905 and the anodic oxide 906. The etching step was interrupted when the thickness of the gate-insulating film 904 reached 500 Å. As a result, a thin insulating film 907 was formed. A stream of phosphorus/hydrogen plasma accelerated at 15 to 50 keV, e.g., 30 keV, was irradiated to implant phosphorus ions into the island-shaped semiconductor regions 903 by a self-aligning process. As a result, doped regions 908 which would become source and drain were formed (FIG. 9(B)).

Subsequently, silicon oxide was deposited as an interlayer insulator 909 having a thickness of 5000 Å. KrF excimer laser light having a wavelength of 248 nm was illuminated to recover the crystallinity of the semiconductor regions 908 which deteriorated in the previous impurity implantation step. At this time, the energy density was 150 to 300 mJ/cm$^2$, e.g., 200 mJ/cm$^2$. Where only a thin insulating film coats a semiconductor surface on laser irradiation as in Example 7, the bombardment which is caused by crystallization of the semiconductor roughens the surface. This presents problems in forming contacts. These problems did not occur in the present example, because a thick insulating film was formed (FIG. 9(C)).

Then, contact holes were formed in the interlayer insulator 909. Source and drain electrodes 910 were formed. Thus, N-channel transistors were completed (FIG. 9(D)).

In the present example, the thick insulating film acting also as an interlayer insulating film was formed on the thin insulating film 907. The thick insulating film may also be formed after removing the thin insulating film completely. When impurity ions are irradiated, a large amount of impurities is introduced into the insulating film, whereby laser light is absorbed. Accordingly, the insulating film containing such impurities is removed completely. Thus, the efficiency of the later laser annealing step can be enhanced.

The present invention provides a method of efficiently conducting ion implantation or ion doping and then laser annealing or lamp annealing. Obviously, the present invention can contribute to a decrease in the temperature of the process and thus yield great industrial advantages. In the illustrated examples, the present invention has been described in connection with MIS transistors having an active layer in the form of a thin film. These transistors are known as thin-film transistors. Restrictions tend to be imposed on the substrates of these thin-film transistors and so a low-temperature process is essential for these transistors. However, it is obvious that where the present invention is applied to MIS transistors formed on a semiconductor substrate consisting of a single crystal, similar advantages can be derived.

In the present invention, semiconductor species constituting the semiconductor regions include silicon, germanium, silicon carbide, silicon-germanium alloys, and gallium arsenide. Examples of the material of the gate electrodes include doped silicon, molybdenum, tungsten, titanium, aluminum, their alloys, silicides, and nitrides. Lasers preferably used in the present invention include excimer lasers such as ArF laser having a wavelength of 193 nm, KrF laser having a wavelength of 248 nm, XeCl laser having a wavelength of 308 nm, and XeF laser having a wavelength of 350 nm, Nd:YAG laser having a wavelength of 1064 nm, its second harmonic (532 nm), its third harmonic (354 nm), and its fourth harmonic (266 nm). Of course, use of other laser or light source is embraced in the scope of the present invention.

What is claimed is:

1. A method of manufacturing a semiconductor device comprising the steps of:

forming a semiconductor layer comprising amorphous silicon on an insulating surface;

crystallizing said semiconductor layer;

patterning the crystallized semiconductor layer to form an island-shaped semiconductor layer;

forming a gate insulating film over the island-shaped semiconductor layer;

forming a gate electrode over said gate insulating film, wherein the gate insulating film extends beyond side edges of the gate electrode;

thinning at least portions of the extending portions of the gate insulating film;

selectively introducing an impurity ion into the island-shaped semiconductor layer to form impurity regions therein by using at least the gate electrode as a mask through the thinned portions of the gate insulating film; and irradiating said semiconductor layer with light through the thinned portions of the gate insulating film in order to activate portions of the island-shaped semiconductor layer introduced with the impurity ion.

2. The method according to claim 1 wherein said semiconductor layer is formed on an insulating film comprising silicon oxide that is formed over a glass substrate.

3. The method according to claim 1 wherein said semiconductor layer comprises a material selected from the group consisting of silicon, germanium, silicon carbide, silicon-germanium alloy and gallium arsenide.

4. The method according to claim 1 wherein the light is laser light.

5. The method according to claim 4 wherein the laser is one of an ArF laser, KrF laser, XeCl laser, XeF laser, and Nd:YAG laser.

6. The method according to claim 1 wherein the light is lamp light.

7. The method according to claim 1 wherein entire upper surfaces of the impurity regions are covered by the thinned portions of the gate insulating film.

8. The method according to claim 1 wherein the gate electrode is covered by an anodic oxide film.

9. The method according to claim 1 wherein the semiconductor layer is crystallized by a second harmonic of an Nd:YAG laser having a wavelength of 532 nm.

10. A method of manufacturing a semiconductor device comprising the steps of:
   forming a semiconductor layer comprising amorphous silicon on an insulating surface;
   crystallizing said semiconductor layer;
   patterning the crystallized semiconductor layer to form an island-shaped semiconductor layer;
   forming a gate insulating film over the island-shaped semiconductor layer;
   forming a mask over said gate insulating film, wherein the gate insulating film extends beyond side edges of the mask;
   thinning at least portions of the extending portions of the gate insulating film;
   selectively introducing an impurity ion into the island-shaped semiconductor layer to form impurity regions therein by using the mask through the thinned portions of the gate insulating film; and
   irradiating said semiconductor layer with light through the thinned portions of the gate insulating film in order to activate portions of the island-shaped semiconductor layer introduced with the impurity ion.

11. The method according to claim 10 wherein the semiconductor layer is formed on an insulating film comprising silicon oxide that is formed over a glass substrate.

12. The method according to claim 10 wherein the semiconductor layer comprises a material selected from the group consisting of silicon, germanium, silicon carbide, silicon-germanium alloy and gallium arsenide.

13. The method according to claim 10 wherein the light is laser light.

14. The method according to claim 13 wherein the laser is one of an ArF laser, KrF laser, XeCl laser, XeF laser, and Nd:YAG laser.

15. The method according to claim 10 wherein the light is lamp light.

16. The method according to claim 10 wherein entire upper surfaces of the impurity regions are covered by the thinned portions of the gate insulating film.

17. The method according to claim 10 wherein the semiconductor layer is crystallized by a second harmonic of an Nd:YAG laser having a wavelength of 532 nm.

18. A method of manufacturing a semiconductor device comprising the steps of:
   forming a gate insulating film over a semiconductor substrate;
   forming a gate electrode over the gate insulating film, wherein the gate insulating film extends beyond side edges of the gate electrode;
   thinning at least portions of the extending portions of the gate insulating film;
   selectively introducing an impurity ion into the semiconductor substrate to form impurity regions therein by using at least the gate electrode as a mask through the thinned portions of the gate insulating film; and
   irradiating said semiconductor substrate with light through the thinned portions of the gate insulating film in order to activate portions of the semiconductor substrate introduced with the impurity ion.

19. The method according to claim 18 wherein the semiconductor substrate comprises a material selected from the group consisting of silicon, germanrum, silicon carbide, silicon-germanium alloy and gallium arsenide.

20. The method according to claim 18 wherein the light is laser light.

21. The method according to claim 20 wherein the laser is one of an ArF laser, KrF laser, XeCl laser, XeF laser, and Nd:YAG laser.

22. The method according to claim 18 wherein the light is lamp light.

23. The method according to claim 18 wherein entire upper surfaces of the impurity regions are covered by the thinned portions of the gate insulating film.

24. The method according to claim 18 wherein the gate electrode is covered by an anodic oxide film.

25. A method of manufacturing a semiconductor device comprising the steps of:
   forming a gate insulating film over a semiconductor substrate;
   forming a mask over the gate insulating film, wherein the gate insulating film extends beyond side edges of the mask;
   thinning at least portions of the extending portions of the gate insulating film;
   selectively introducing an impurity ion into the semiconductor substrate to form impurity regions therein by using at least the mask through the thinned portions of the gate insulating film; and
   irradiating said semiconductor substrate with light through the thinned portions of the gate insulating film in order to activate portions of the semiconductor substrate introduced with the impurity ion.

26. The method according to claim 25 wherein the semiconductor substrate comprises a material selected from the group consisting of silicon germanium, silicon carbide, silicon-germanium alloy and gallium arsenide.

27. The method according to claim 25 wherein the light is laser light.

28. The method according to claim 27 wherein the laser is one of an ArF laser, KrF laser, XeCl laser, XeF laser, and Nd:YAG laser.

29. The method according to claim 27 wherein entire upper surfaces of the impurity regions are covered by the thinned portions of the gate insulating film.

30. The method according to claim 25 wherein the light is lamp light.

* * * * *